US007909619B2

(12) United States Patent
Pepe et al.

(10) Patent No.: US 7,909,619 B2
(45) Date of Patent: Mar. 22, 2011

(54) CASSETTE WITH LOCKING FEATURE

(75) Inventors: Paul John Pepe, Clemmons, NC (US); Richard Ralph Jones, Jamestown, NC (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/395,144

(22) Filed: Feb. 27, 2009

(65) Prior Publication Data

US 2010/0221954 A1 Sep. 2, 2010

(51) Int. Cl.
*H01R 12/00* (2006.01)
*H05K 1/00* (2006.01)

(52) U.S. Cl. .................................... 439/76.1; 439/541.5

(58) Field of Classification Search .................... 439/79, 439/80, 76.1, 541.5, 607.01, 350–358, 676, 439/649, 648, 638

See application file for complete search history.

(56) References Cited

U.S. PATENT DOCUMENTS

| | | | | |
|---|---|---|---|---|
| 3,945,706 A | | 3/1976 | Steiner et al. | |
| 5,178,554 A | | 1/1993 | Siemon et al. | |
| 5,217,394 A | * | 6/1993 | Ho | 439/620.21 |
| 5,509,812 A | * | 4/1996 | Comerci et al. | 439/76.1 |
| 5,562,493 A | | 10/1996 | Ferrill et al. | |
| 5,639,261 A | | 6/1997 | Rutkowski et al. | |
| 5,647,765 A | | 7/1997 | Haas et al. | |
| 5,700,167 A | | 12/1997 | Pharney et al. | |
| 5,735,708 A | | 4/1998 | Arnett et al. | |
| 5,735,712 A | | 4/1998 | Haas et al. | |
| 5,741,153 A | | 4/1998 | Schwer | |
| 5,800,207 A | * | 9/1998 | Hsu et al. | 439/541.5 |
| 5,924,890 A | | 7/1999 | Morin et al. | |
| 6,053,964 A | | 4/2000 | Curry et al. | |
| 6,066,001 A | | 5/2000 | Liptak et al. | |
| 6,074,251 A | | 6/2000 | Edgerly et al. | |
| 6,120,318 A | | 9/2000 | Reed et al. | 439/490 |
| 6,132,260 A | | 10/2000 | Wu | |
| 6,168,474 B1 | | 1/2001 | German et al. | |
| 6,222,908 B1 | | 4/2001 | Bartolutti et al. | |
| 6,227,911 B1 | | 5/2001 | Boutros et al. | |
| 6,269,008 B1 | | 7/2001 | Hsu | |
| 6,302,742 B1 | | 10/2001 | Berst et al. | |
| 6,319,047 B1 | | 11/2001 | Kang | |
| 6,364,707 B1 | | 4/2002 | Wang | |

(Continued)

FOREIGN PATENT DOCUMENTS

EP 1458062 9/2004

(Continued)

OTHER PUBLICATIONS

International Search Report, International Application No. PCT/US2010/000564, International Filing Date Feb. 24, 2010, 3 pgs.

*Primary Examiner* — Javaid Nasri

(57) ABSTRACT

A cassette includes a shell having a housing and a cover mated together to define an inner chamber. The housing has a plurality of plug cavities configure to receive plugs therein. A contact subassembly is received in the inner chamber. The contact subassembly has a circuit board and a plurality of contacts coupled to the circuit board. The contacts are arranged in contact sets that are received in corresponding plug cavities to mate with different corresponding plugs. A latch member couples the housing to the cover. The latch member has a latch element configured to secure the shell to a panel.

20 Claims, 11 Drawing Sheets

U.S. PATENT DOCUMENTS

| | | | | |
|---|---|---|---|---|
| 6,364,713 | B1 | 4/2002 | Kuo | |
| 6,540,564 | B1 | 4/2003 | Ko | 439/676 |
| 6,608,764 | B2 | 8/2003 | Clark et al. | |
| 6,612,867 | B1 | 9/2003 | Wu | |
| 6,626,697 | B1 | 9/2003 | Martin et al. | |
| 6,655,988 | B1 | 12/2003 | Simmons et al. | 439/541.5 |
| 6,780,035 | B2 | 8/2004 | Bohbot | |
| 6,786,772 | B1 | 9/2004 | Liu | |
| 6,802,735 | B2 | 10/2004 | Pepe et al. | 439/488 |
| 6,976,867 | B2 | 12/2005 | Navarro et al. | 439/489 |
| 6,988,914 | B2 | 1/2006 | Pepe | |
| 7,033,210 | B1 | 4/2006 | Laurer et al. | |
| 7,077,707 | B2 | 7/2006 | Hyland et al. | 439/676 |
| 7,140,924 | B2 | 11/2006 | Redfield et al. | |
| 7,207,846 | B2 * | 4/2007 | Caveney et al. | 439/676 |
| 7,300,307 | B2 | 11/2007 | Murr | |
| 7,357,675 | B2 | 4/2008 | Barringer et al. | |
| 7,367,850 | B1 | 5/2008 | Chang | |
| 7,384,310 | B2 | 6/2008 | Hu et al. | |
| 7,530,854 | B2 | 5/2009 | Aekins et al. | |
| 7,605,707 | B2 * | 10/2009 | German et al. | 340/572.8 |
| 2003/0095395 | A1 | 5/2003 | Clark et al. | |
| 2004/0209515 | A1 | 10/2004 | Caveney et al. | |
| 2004/0229501 | A1 | 11/2004 | Caveney et al. | |
| 2004/0246693 | A1 | 12/2004 | Lloyd et al. | |
| 2005/0136747 | A1 | 6/2005 | Caveney et al. | |
| 2005/0159036 | A1 * | 7/2005 | Caveney et al. | 439/188 |
| 2005/0164548 | A1 | 7/2005 | Spears et al. | |
| 2005/0185912 | A1 | 8/2005 | Levesque | |
| 2005/0282432 | A1 | 12/2005 | Murr et al. | |
| 2005/0282441 | A1 | 12/2005 | Murr et al. | |
| 2006/0148279 | A1 * | 7/2006 | German et al. | 439/49 |
| 2006/0246784 | A1 | 11/2006 | Aekins et al. | |
| 2007/0032129 | A1 | 2/2007 | Kim et al. | |
| 2007/0066141 | A1 | 3/2007 | Shu et al. | |
| 2008/0090461 | A1 | 4/2008 | Pepe et al. | |

FOREIGN PATENT DOCUMENTS

| | | | | |
|---|---|---|---|---|
| GB | 2339090 | | | 1/2000 |
| WO | WO 2004/091055 | | | 10/2004 |
| WO | WO 2005/053111 | | | 6/2005 |
| WO | WO 2005/053111 | A1 | * | 6/2005 |
| WO | WO 2006/063023 | | | 6/2006 |
| WO | WO 2006/063023 | A1 | * | 6/2006 |
| WO | WO 2007/044855 | | | 4/2007 |

* cited by examiner

CASSETTE WITH LOCKING FEATURE

CROSS REFERENCE TO RELATED APPLICATIONS

This application is related to copending U.S. patent application Ser. No. 12/394,816, filed Feb. 27, 2009, the subject matter of which is herein incorporated by reference in its entirety. U.S. patent application Ser. No. 12/394,816, filed Feb. 27, 2009, relates to U.S. patent application Ser. No. 12/394,912, filed Feb. 27, 2009, relates to U.S. patent application Ser. No. 12/394,987, filed Feb. 27, 2009, and relates to U.S. patent application Ser. No. 12/395,049, filed Feb. 27, 2009.

BACKGROUND OF THE INVENTION

The subject matter herein relates generally to cassettes, and more particularly, to locking features for securing cassettes in panel openings.

Known connector assemblies exist having multiple receptacle connectors in a common housing, which provide a compact arrangement of such receptacle connectors. Such a connector assembly is useful to provide multiple connection ports. Accordingly, such a connector assembly is referred to as a multiple port connector assembly. The receptacle connectors may be in the form of RJ-45 type modular jacks that establish mating connections with corresponding RJ-45 modular plugs. The receptacle connectors each have electrical terminals arranged in a terminal array, and have plug receiving cavities.

One application for such multi-port connector assemblies is in the field of computer networks, where desktops or other equipment are interconnected to servers or other network components by way of sophisticated cabling. Such networks may have a variety of data transmission mediums including coaxial cable, fiber optic cable and telephone cable. One such network is an Ethernet network, which is subject to various electrical standards, such as IEEE 802.3 and others. Such networks have the requirement, to provide a high number of connections, yet optimally requires little space in which to accommodate the connections. Another application for such connector assemblies is in the field of telephony, wherein the modular jacks provide ports for connection with a telephone switching network of a telephone service provider, such as a regional telephone company or national telephone company.

One type of known connector assembly includes a housing having receptacles one above the other, forming a plurality of arrays in stacked arrangement, so-called “stacked jack” arrangements. One example of a stacked jack type of connector assembly is disclosed in U.S. Pat. No. 6,655,988, assigned to Tyco Electronics Corporation, which discloses an insulative housing having two rows of receptacles. The receptacles are arranged side-by-side in an upper row and side-by-side in a lower row in a common housing, which advantageously doubles the number of receptacles without having to increase the length of the housing. Contact modules having contacts for both upper receptacles and lower receptacles are loaded into the insulative housing.

The insulative housing and each of the contact modules are simultaneously mounted to a circuit board, and an outer shield surrounds the unit. An outer shield surrounds the insulative housing and the contact modules. The outer shield is mounted to the circuit board. Mounting the outer shield to the circuit board is a manufacturing step that takes time and may be difficult to accomplish. Other types of connector assemblies include outer shields that are assembled using fasteners, such as screws or rivets to assemble the components together. Assembling components using fasteners such as screws or rivets is complex and time consuming. Additionally, assembly using fasteners such as screws or rivets is difficult when the manufacturing process involves automation.

A need remains for a connector assembly that may be assembled in a cost effective and reliable manner. A need remains for a connector assembly that includes locking features that quickly and securely mate the outer components together.

BRIEF DESCRIPTION OF THE INVENTION

In one embodiment, a cassette is provided that includes a shell having a housing and a cover mated together to define an inner chamber. The housing has a plurality of plug cavities configure to receive plugs therein. A contact subassembly is received in the inner chamber. The contact subassembly has a circuit board and a plurality of contacts coupled to the circuit board. The contacts are arranged in contact sets that are received in corresponding plug cavities to mate with different corresponding plugs. A latch member couples the housing to the cover. The latch member has a latch element configured to secure the shell to a panel.

Optionally, the latch member may be separate from both the housing and the cover and the latch member may be coupled to both the housing and the cover. The housing may include a rib extending therefrom and the latch member may include a channel that receives the rib to secure the relative position of the latch member with respect to the housing. The cover may include a rib extending therefrom and the latch member may include a channel that receives the rib to secure the relative position of the latch member with respect to the cover. Optionally, the housing may include a trough and the latch member may be received within the trough to secure the latch member with respect to the housing. The cover may include a trough and the latch member may be received within the trough to secure the latch member with respect to the cover. The latch member may include a base spanning the housing and the cover where the base is coupled to both the housing and the cover. The latch element may extend from the base.

In another embodiment, a cassette is provided including a shell having a housing and a cover mated together to define an inner chamber with the housing having a plurality of plug cavities configure to receive plugs therein. At least one of the housing and the cover have a locking finger engaging the other one of the housing and the cover to secure the cover to the housing. A contact subassembly is received in the inner chamber. The contact subassembly has a circuit board and a plurality of contacts coupled to the circuit board, and the contacts are arranged in contact sets that are received in corresponding plug cavities to mate with different corresponding plugs. The cassette also includes a latch member that is separately provided from the housing and the cover. The latch member is separately coupled to both the housing and the cover to secure the cover to the housing.

In a further embodiment, a cassette is provided that includes a shell having a housing and a cover mated together to define an inner chamber, wherein the housing has a plurality of plug cavities configure to receive plugs therein. A contact subassembly is received in the inner chamber. The contact subassembly has a circuit board and a plurality of contacts coupled to the circuit board, with the contacts being arranged in contact sets that are received in corresponding plug cavities to mate with different corresponding plugs. A latch member couples the housing to the cover. The latch member has a latch element configured to secure the shell to a panel. The latch member extends from either the housing or the cover towards the other of the housing or the cover prior to coupling the cover to the housing. The latch member aligns the cover with the housing as the cover is coupled to the housing.

DETAILED DESCRIPTION OF THE INVENTION

Figure 1:
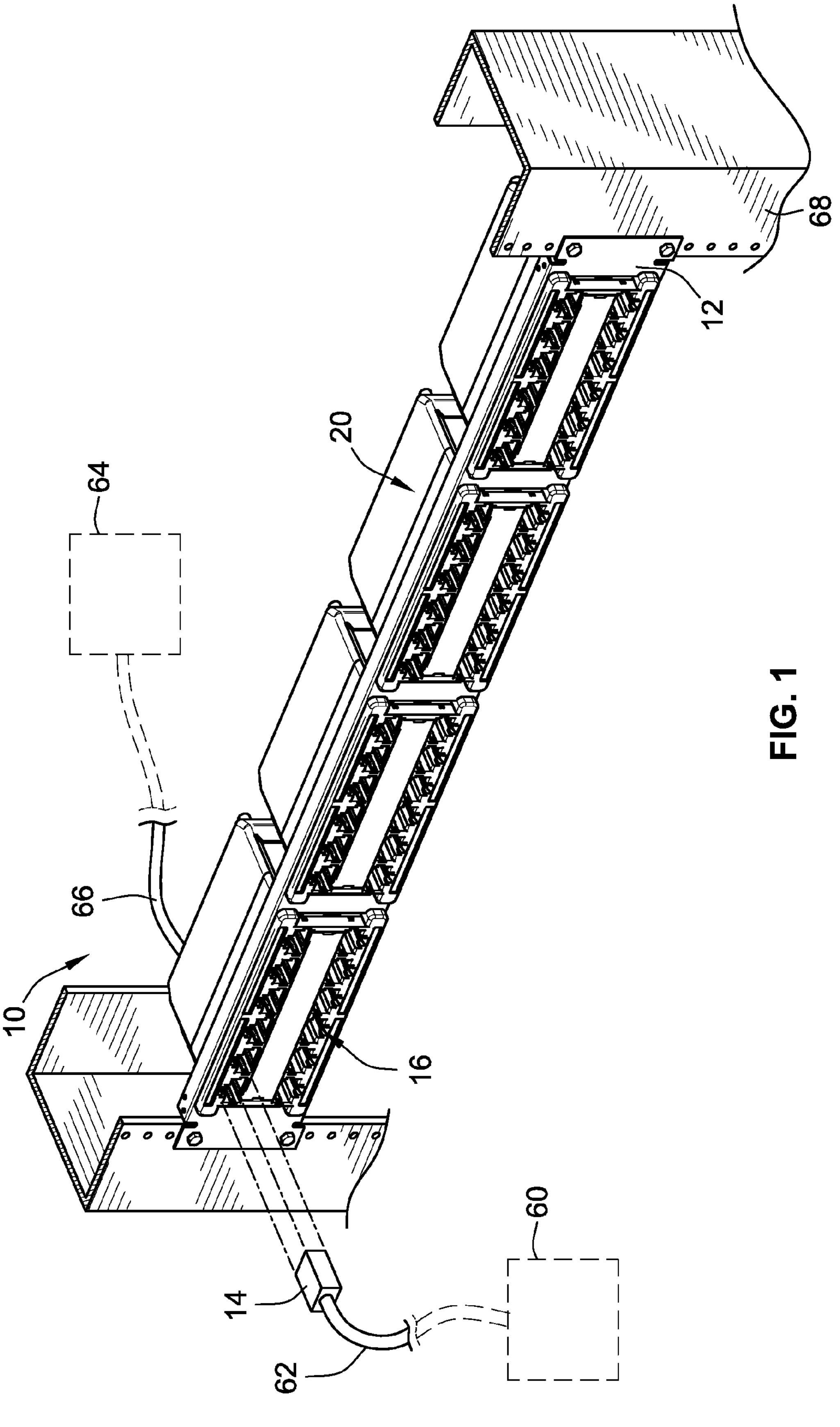
FIG. 1 is a front perspective view of a portion of a cable interconnect system incorporating a plurality of cassettes mounted to the panel with a modular plug connected thereto.

FIG. 1 is a front perspective view of a portion of a cable interconnect system 10 illustrating a panel 12 and a plurality of cassettes 20 mounted to the panel 12 and a modular plug 14 connected thereto. The cassette 20 comprises an array of receptacles 16 for accepting or receiving the modular plug 14.

The cable interconnect system 10 is utilized to interconnect various equipment, components and/or devices to one another. FIG. 1 schematically illustrates a first device 60 connected to the cassette 20 via a cable 62. The modular plug 14 is attached to the end of the cable 62. FIG. 1 also illustrates a second device 64 connected to the cassette 20 via a cable 66. The cassette 20 interconnects the first and second devices 60, 64. In an exemplary embodiment, the first device 60 may be a computer located remote from the cassette 20. The second device 64 may be a network switch. The second device 64 may be located in the vicinity of the cassette 20, such as in the same equipment room, or alternatively, may be located remote from the cassette 20. The cable interconnect system 10 may include a support structure 68, a portion of which is illustrated in FIG. 1, for supporting the panel 12 and the cassettes 20. For example, the support structure 68 may be an equipment rack of a network system. The panel 12 may be a patch panel that is mounted to the equipment rack. In alternative embodiments, rather than a patch panel, the panel 12 may be another type of network component used with a network system that supports cassettes 20 and/or other connector assemblies, such as interface modules, stacked jacks, or other individual modular jacks. For example, the panel 12 may be a wall or other structural element of a component. It is noted that the cable interconnect system 10 illustrated in FIG. 1 is merely illustrative of an exemplary system/component for interconnecting communication cables using modular jacks and modular plugs or other types of connectors. Optionally, the second device 64 may be mounted to the support structure 68.

Figure 2:
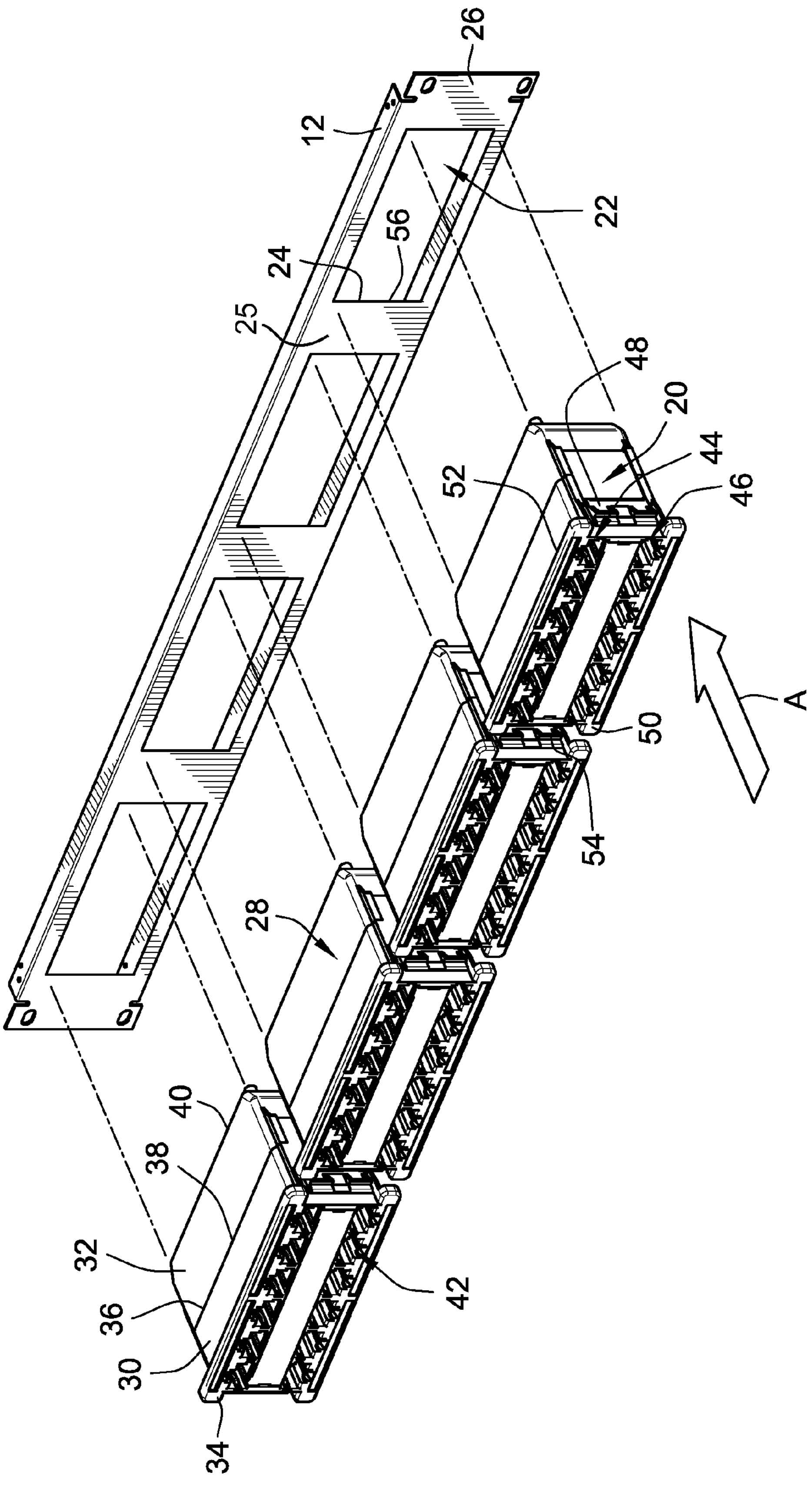
FIG. 2 is an exploded view of the panel and the cassettes illustrated in FIG. 1.

FIG. 2 is an exploded view of the panel 12 and the cassettes 20. The cassettes 20 are mounted within openings 22 of the panel 12. The openings 20 are defined by a perimeter wall 24. In an exemplary embodiment, the panel 1 2 includes a plurality of openings 22 for receiving a plurality of cassettes 20. The panel 12 includes a planar front surface 25, and the cassettes 20 are mounted against the front surface 25. The panel 12 includes mounting tabs 26 on the sides thereof for mounting to the support structure 68 (shown in FIG. 1). For example, the mounting tabs 26 may be provided at the sides of the panel. 12 for mounting to a standard equipment rack or other cabinet system. Optionally, the panel 12 and mounting tabs 26 fit into 1 U height requirements.

The cassette 20 includes a shell 28 defining an outer perimeter of the cassette 20. In an exemplary embodiment, the shell 28 is a two piece design having a housing 30 and a cover 32 that may be coupled to the housing 30. The housing 30 and the cover 32 may have similar dimensions (e.g. height and width) to nest with one another to define a smooth outer surface. The housing 30 and the cover 32 may also have similar lengths, such that the housing 30 and the cover 32 mate approximately in the middle of the shell 28. Alternatively, the housing 30 may define substantially all of the shell 28 and the cover 32 may be substantially Oat and be coupled to an end of the housing 30. Other alternative embodiments may not include the cover 32.

The housing 30 includes a front 34 and a rear 36. The cover 32 includes a front 38 and a rear 40. The front 34 of the housing 30 defines a front of the cassette 20 and the rear 40 of the cover 32 defines a rear of the cassette 20. In an exemplary embodiment, the cover 32 is coupled to the housing 30 such that the rear 36 of the housing 30 abuts against the front 38 of the cover 32.

The housing 30 includes a plurality of plug cavities 42 open at the front 34 of the housing 30 for receiving the modular plugs 14 (shown in FIG. 1). The plug cavities 42 define a portion of the receptacles 16. In an exemplary embodiment, the plug cavities 42 are arranged in a stacked configuration in a first row 44 and a second row 46 of plug cavities 42. A plurality of plug cavities 42 are arranged in each of the first and second rows 44, 46. In the illustrated embodiment, six plug cavities 42 are arranged in each of the first and second rows 44, 46, thus providing a total of twelve plug cavities 42 in each cassette 20. Four cassettes 20 are provided that are mounted to the panel 12, thus providing a total of forty-eight plug cavities 42. Such an arrangement provides forty-eight plug cavities 42 that receive forty-eight modular plugs 14 within the panel 12 that fits within 1 U height requirement. It is realized that the cassettes 20 may have more or less than twelve plug cavities 42 arranged in more or less than two rows of plug cavities 42. It is also realized that more or less than four cassettes 20 may be provided for mounting to the panel 12.

The cassette 20 includes latch members 48 on one or more sides of the cassette 20 for securing the cassette 20 to the panel 12. The latch members 48 may be held close to the sides of the cassette 20 to maintain a smaller form factor. Alternative mounting means may be utilized in alternative embodiments. The latch members 48 may be separately provided from the housing 30 and/or the cover 32. Alternatively, the latch members 48 may be integrally formed with the housing 30 and/or the cover 32.

During assembly, the cassettes 20 are loaded into the openings 22 of the panel 12 from the front of the panel 12, such as in the loading direction illustrated in FIG. 2 by an arrow A. The outer perimeter of the cassette 20 may be substantially similar to the size and shape of the perimeter walls 24 defining the openings 22 such that the cassette 20 fits snugly within the openings 22. The latch members 48 are used to secure the cassettes 20 to the panel 12. In an exemplary embodiment, the cassettes 20 include a front flange 50 at the front 34 of the housing 30. The front flanges 50 have a rear engagement surface 52 that engages the front surface 25 of the panel 12 and the cassette 20 is loaded into the openings 22. The latch members 48 include a panel engagement surface 54 that is forward facing such that, when the cassette 20 is loaded into the opening 22, the panel engagement surface 54 engages a rear 56 of the panel 12. The panel 12 is captured between the rear engagement surface 52 of the front flanges 50 and the panel engagement surface 54 of the latch members 48.

Figure 3:
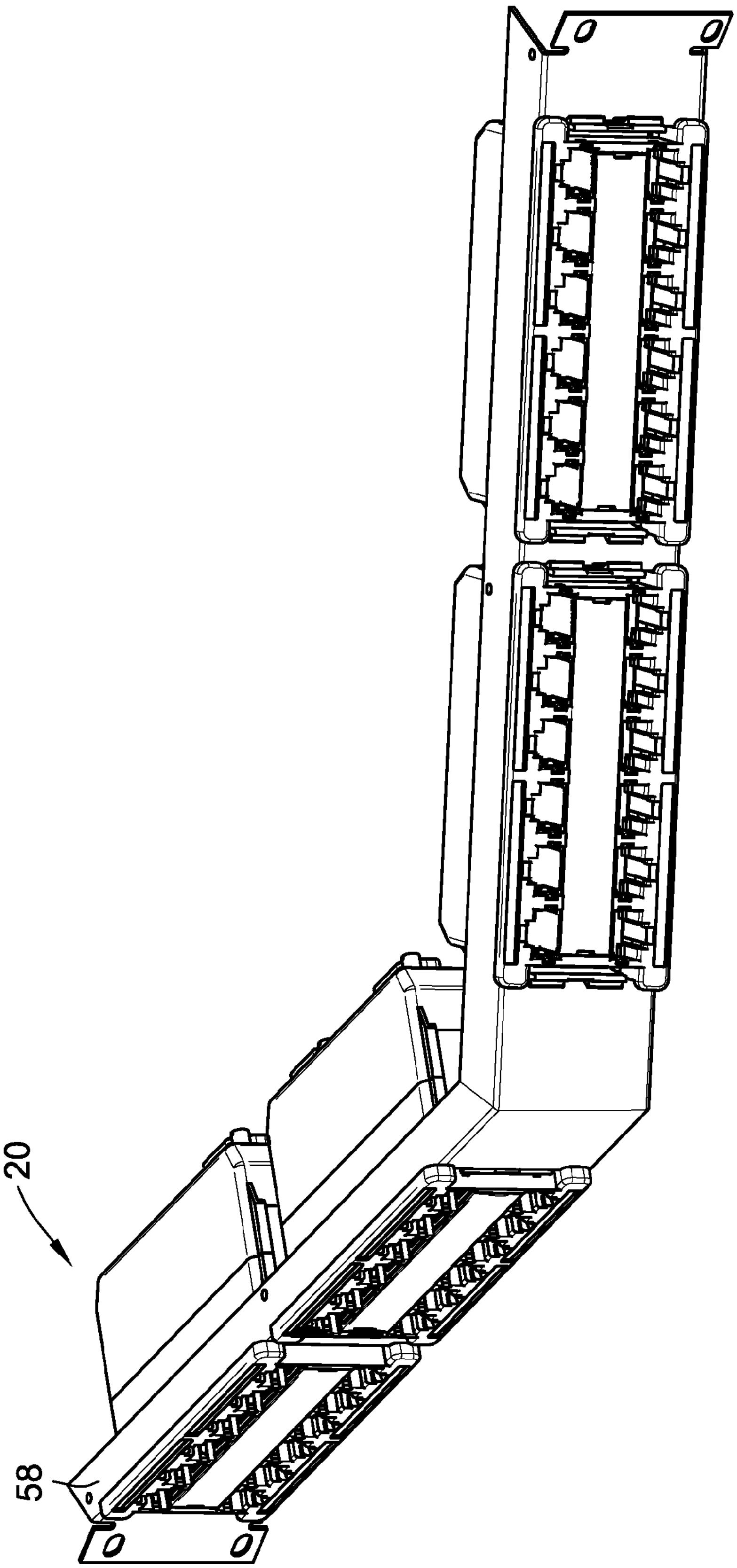
FIG. 3 is a front perspective view of an alternative panel for the cable interconnect system with cassettes mounted thereto.

FIG. 3 is a front perspective view of an alternative panel 58 for the cable interconnect system 10 with cassettes 20 mounted thereto. The panel 58 has a V-configuration such that the cassettes 20 are angled in different directions. Other panel configurations are possible in alternative embodiments. The cassettes 20 may be mounted to the panel 58 in a similar manner as the cassettes 20 are mounted to the panel 12 (shown in FIG. 1). The panel 58 may fit within 1U height requirements.

Figure 4:
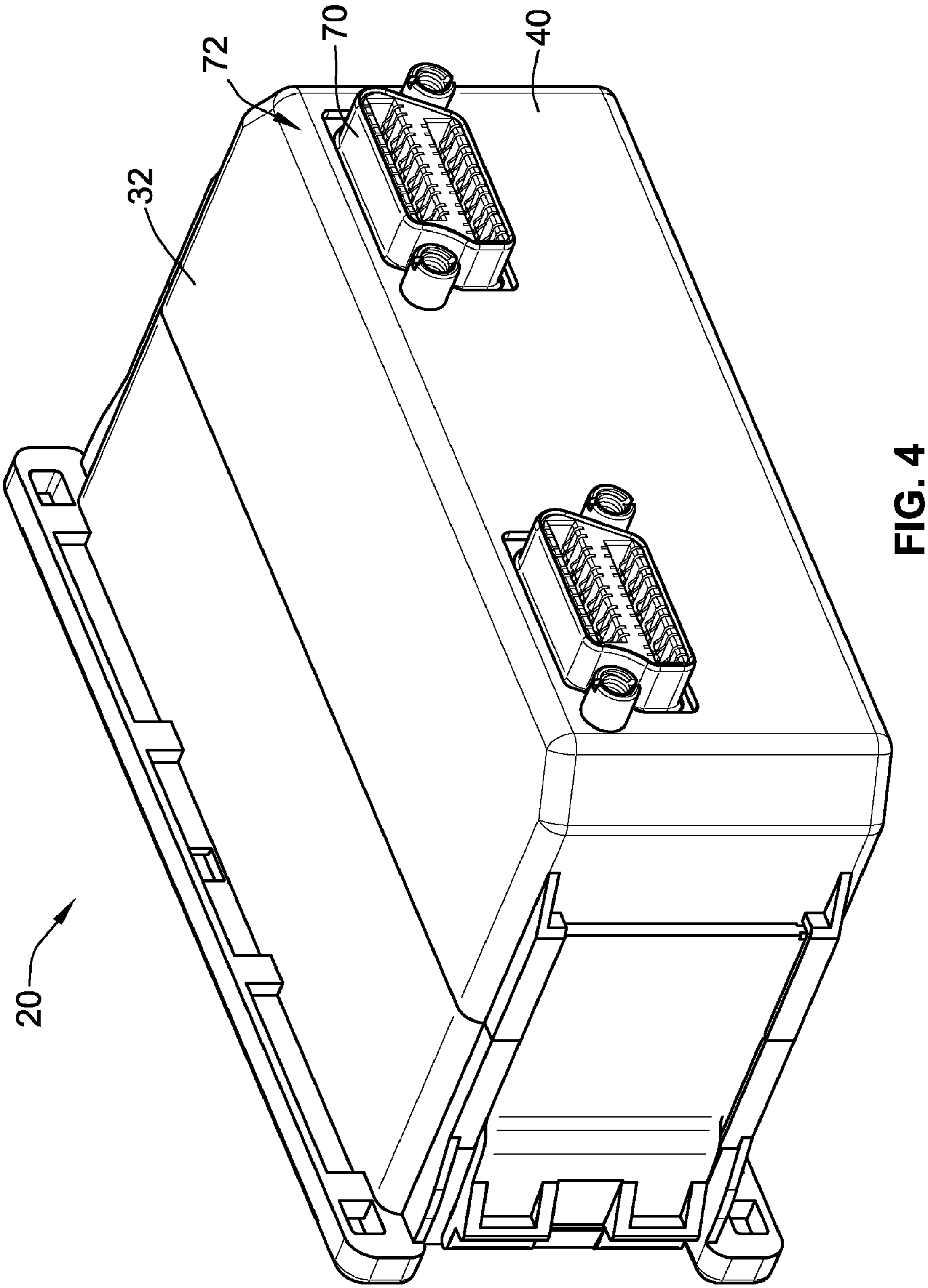
FIG. 4 is a rear perspective view of a cassette shown in FIG. 1.

FIG. 4 is a rear perspective view of one of the cassettes 20 illustrating a plurality of rear mating connectors 70. The rear mating connectors 70 are configured to mate with cable assemblies having a mating cable connector where the cable assemblies are routed to another device or component of the cable interconnect system 10 (shown in FIG. 1). For example, the cable connectors may be provided at ends of cables that are routed behind the panel 12 to a network switch or other network component. Optionally, a portion of the rear mating connectors 70 may extend through an opening 72 in the rear 40 of the cover 32. In the illustrated embodiment, the rear mating connectors 70 are represented by board mounted MRJ-21 connectors, however, it is realized that other types of connectors may be used rather than MRJ-21 type of connectors. For example, in alternative embodiments, the rear mating connectors 70 may be another type of copper-based modular connectors, fiber optic connectors or other types of connectors, such as eSATA connectors, HDMI connectors, USB connectors, FireWire connectors, and the like.

As will be described in further detail below, the rear mating connectors 70 are high density connectors, that is, each rear mating connector 70 is electrically connected to more than one of the-receptacles 16 (shown in FIG. 1) to allow communication between multiple modular plugs 14 (shown in FIG. 1) and the cable connector that mates with the rear mating connector 70. The rear mating connectors 70 are electrically connected to more than one receptacles 16 to reduce the number of cable assemblies that interface with the rear of the cassette 20. It is realized that more or less than two rear mating connectors 70 may be provided in alternative embodiments.

Figure 5:
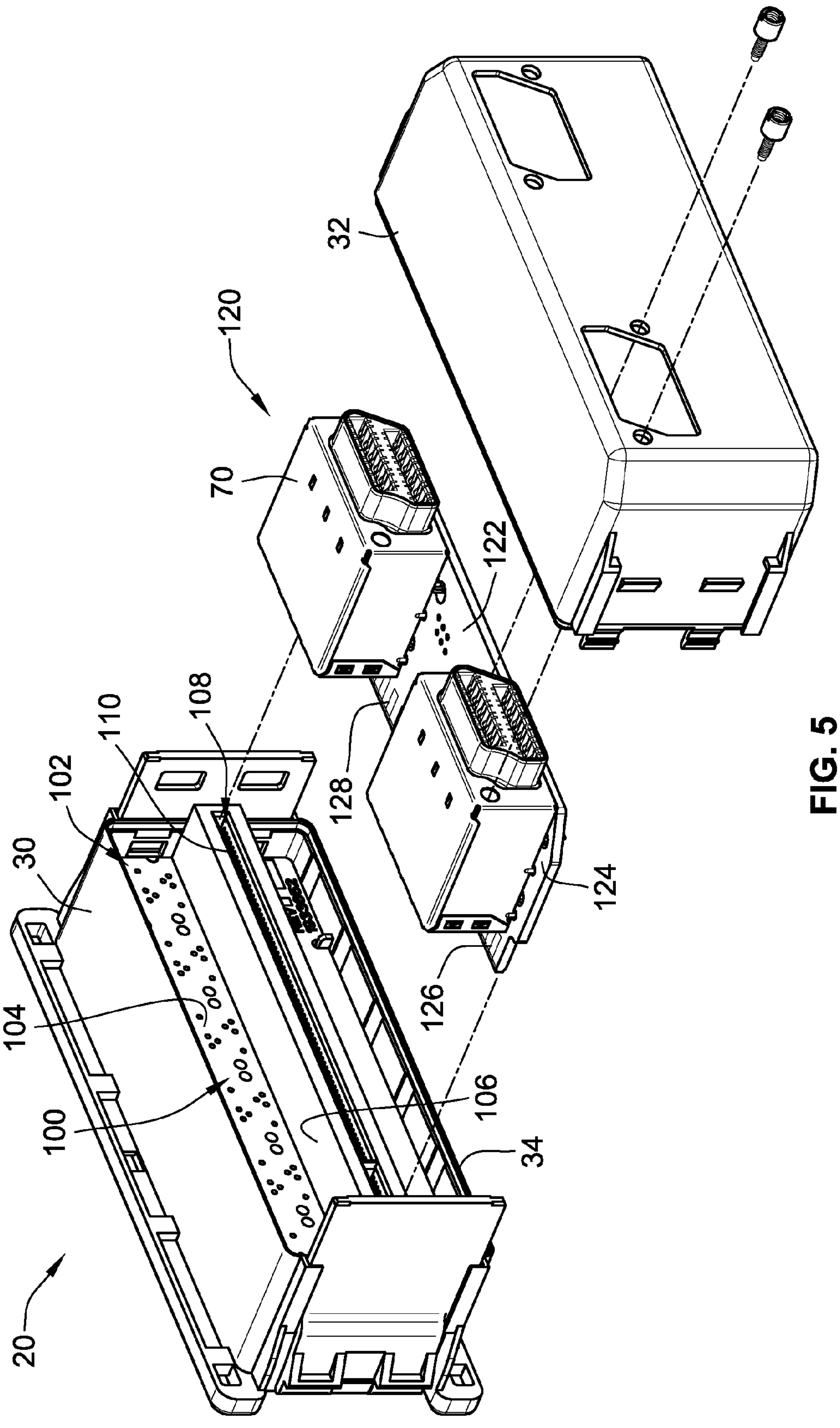
FIG. 5 is a rear exploded view of the cassette shown in FIG. 4.

FIG. 5 is a rear exploded view of the cassette 20 illustrating the cover 32 removed from the housing 30. The cassette 20 includes a contact subassembly 100 loaded into the housing 30. In an exemplary embodiment, the housing 30 includes a rear chamber 102 at the rear 36 thereof. The contact subassembly 100 is at least partially received in the rear chamber 102. The contact subassembly 100 includes a circuit board 104 and one or more electrical connectors 106 mounted to the circuit board 104. In an exemplary embodiment, the electrical connector 106 is a card edge connector. The electrical connector 106 includes at least one opening 108 and one or more contacts 110 within the opening 108. In the illustrated embodiment, the opening 108 is an elongated slot and a-plurality of contacts 110 are arranged within the slot. The contacts 110 may be provided on one or both sides of the slot. The contacts 110 may be electrically connected to the circuit board 104.

The cassette 20 includes an interface connector assembly 120 that includes the, rear mating connectors 70. The interface connector assembly 120 is configured to be mated with the electrical connector 106. In an exemplary embodiment, the interface connector assembly 120 includes a circuit board 122. The rear mating connectors 70 are mounted to a side surface 124 of the circuit board 122. In an exemplary embodiment, the circuit board 122 includes a plurality of edge contacts 126 along an edge 128 of the circuit board 122. The edge contacts 126 may be mated with the contacts 110 of the contact subassembly 100 by plugging the edge 128 of the circuit board 122 into the opening 108 of the electrical connector 106. The edge contacts 126 are electrically connected to the rear mating connectors 70 via the circuit board 122. For example, traces may be provided on or in the circuit board 122 that interconnect the edge contacts 126 with the rear mating connectors 70. The edge contacts 126 may be provided on one or more sides of the circuit board 122. The edge contacts 126 may be contact pads formed on the circuit board 122. Alternatively, the edge contacts 126 may extend from at least one of the surfaces and/or the edge 128 of the circuit board 122. In alternative embodiment, rather than using: edge contacts 126, the interface connector assembly 120 may include an electrical connector at, or proximate to, the edge 128 for mating with the electrical connector 106 of the contact subassembly 100.

Figure 6:
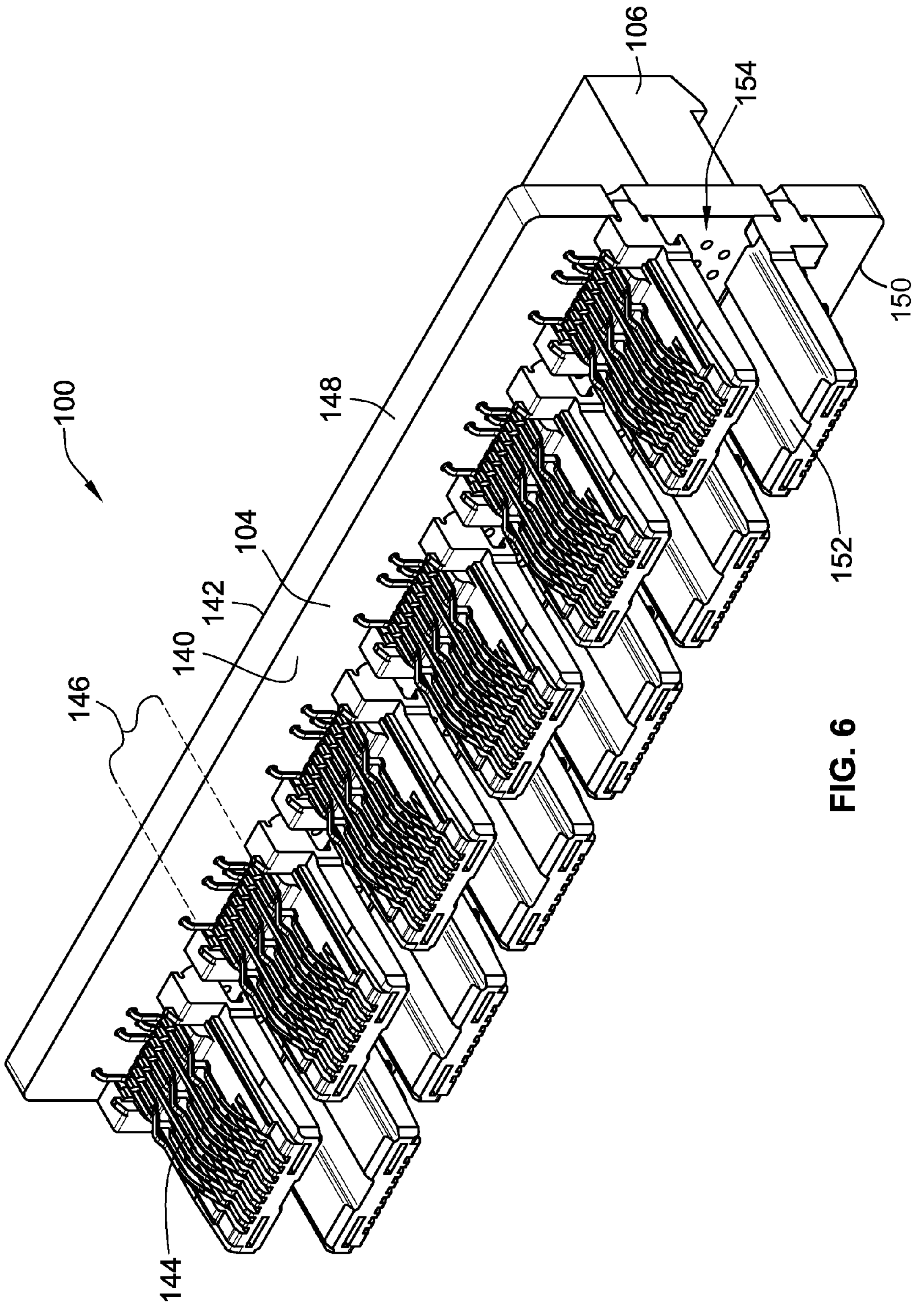
FIG. 6 illustrates a contact subassembly of the cassette shown in FIG. 4.

FIG. 6 illustrates the contact subassembly 100 of the cassette 20 (shown in FIG. 4). The circuit board 104 of the contact subassembly 100 includes a front side 140 and a rear side 142. The electrical connector 106 is mounted to the rear side 142. A plurality of contacts 144 extend from the front side 140 of the circuit board 104. The contacts 144 are electrically connected to the circuit board 104 and are electrically connected to the electrical connector 106 via the circuit board 104.

The contacts 144 are arranged in contact sets 146 with each contact set 146 defining a portion of a different receptacle 16 (shown in FIG. 1). For example, in the illustrated embodiment, eight contacts 144 are configured as a contact array defining each of the contact sets 146. The contacts 144 may constitute a contact array that is configured to mate with plug contacts of an RJ-45 modular plug. The contacts 144 may have a different configuration for mating with a different type of plug in alternative embodiments. More or less than eight contacts 144 may be provided in alternative embodiments. In the illustrated embodiment, six contact sets 146 are arranged in each of two rows in a stacked configuration, thus providing a total of twelve contact sets 146 for the contact subassembly 100. Optionally, the contact sets 146 may be substantially aligned with one another within each of the rows and may be aligned above or below another contact set 146. For example, an upper contact set 146 may be positioned relatively closer to a top 148 of the circuit board 104 as compared to a lower contact set 146 which may be positioned relatively closer to a bottom 150 of the circuit board 104.

In an exemplary embodiment, the contact subassembly 100 includes a plurality of contact supports 152 extending from the front side 140 of the circuit board 104. The contact supports 152 are positioned in close proximity to respective contact sets 146. Optionally, each contact support 152 supports the contacts 144 of a different contact set 146. In the illustrated embodiment, two rows of contact supports 152 are provided. A gap 154 separates the contact supports 152. Optionally, the gap 154 may be substantially centered between the top 148 and the bottom 150 of the circuit board 104.

During assembly, the contact subassembly 100 is loaded into the housing 30 (shown in FIG. 2) such that the contact sets 146 and the contact supports 152 are loaded into corresponding plug cavities 42 (shown in FIG. 2). In an exemplary embodiment, a portion of the housing 30 extends between adjacent contact supports 152 within a row, and a portion of the housing 30 extends into the gap 154 between the contact supports 152.

Figure 7:
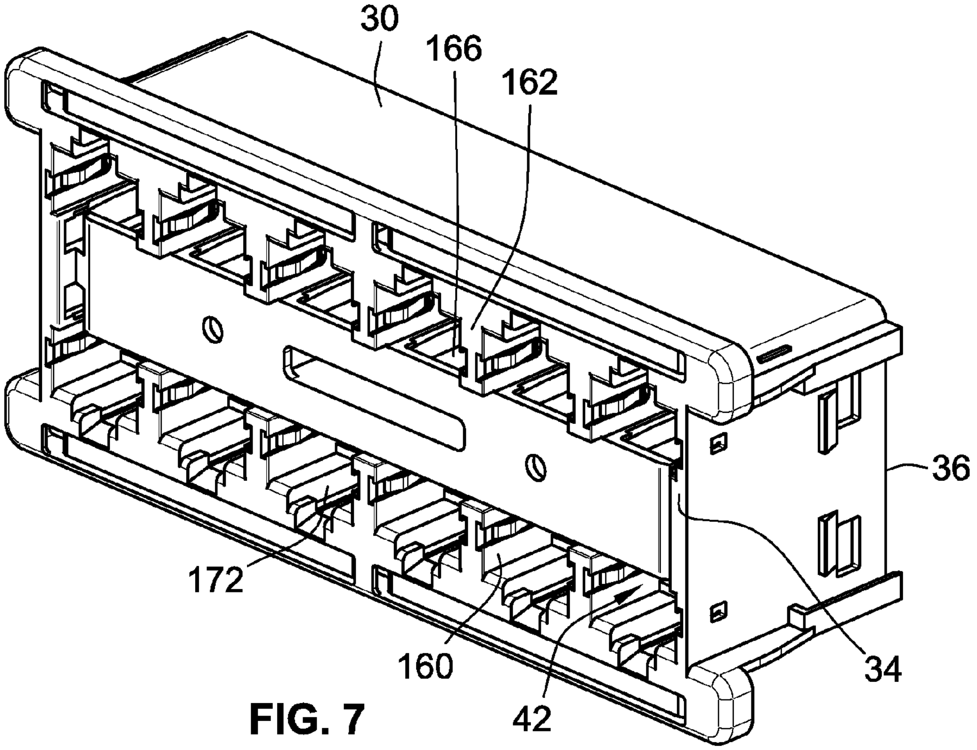
FIG. 7 is a front perspective view of a housing of the cassette shown in FIG. 4.
Figure 8:
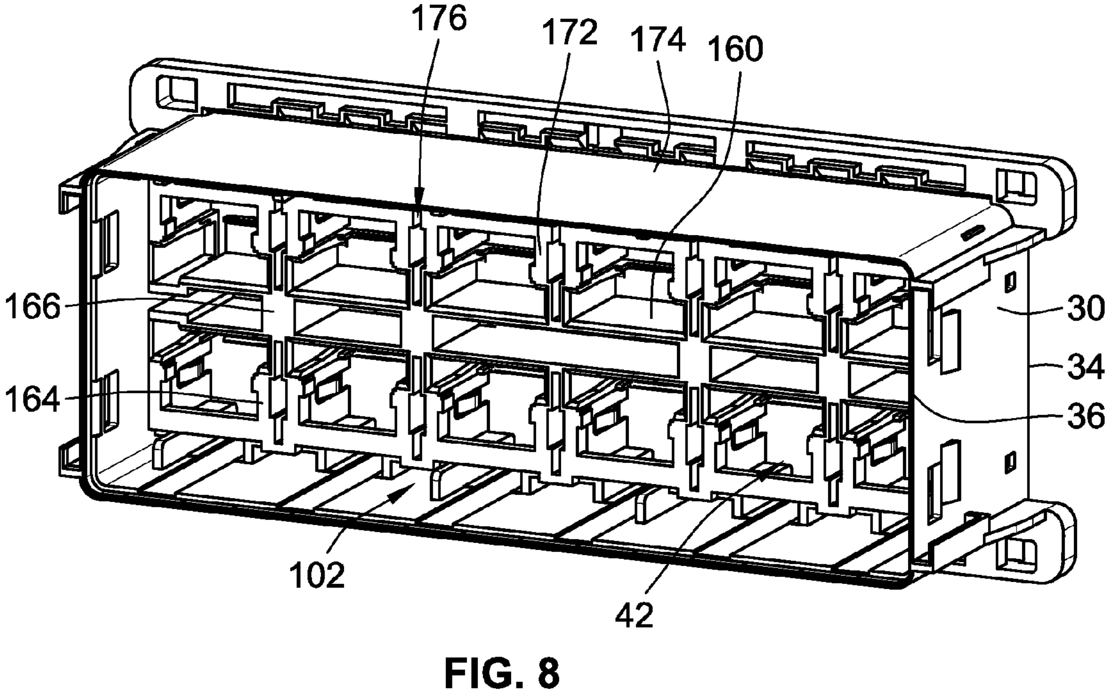
FIG. 8 is a rear perspective view of the housing shown in FIG. 7.

FIGS. 7 and 8 are front and rear perspective views, respectively, of the housing 30 of the cassette 20 (shown in FIG. 1). The housing 30 includes a plurality of interior walls 160 that extend between adjacent plug cavities 42. The walls 160 may extend at least partially between the front 34 and the rear 36 of the housing 30. The walls 160 have a front surface 162 (shown in FIG. 7) and a rear surface 164 (shown in FIG. 8). Optionally, the front surface 162 may be positioned at, or proximate to, the front 34 of the housing 30. The rear surface 164 may be positioned remote with respect to, and/or recessed from, the rear 36 of the housing 30. The housing 30 includes a tongue 166 represented by one of the walls 160 extending between the first and second rows 44, 46 of plug cavities 42. Optionally, the interior walls 160 may be formed integral with the housing 30.

In an exemplary embodiment, the housing 30 includes a rear chamber 102 (shown in FIG. 8) at the rear 36 of the housing 30. The rear chamber 102 is open to each of the plug cavities 42. Optionally, the rear chamber 102 extends from the, rear 36 of the housing 30 to the rear surfaces 164 of the walls 160. The rear chamber 102 is open at the rear 36 of the housing 30. In the illustrated embodiment, the rear chamber 102 is generally box-shaped, however the rear chamber 102 may have any other shape depending on the particular application and/or the size and shape of the components filling the rear chamber 102.

In an exemplary embodiment, the plug cavities 42 are separated from adjacent plug cavities 42 by shield elements 172. The shield elements 172 may be defined by the interior walls 160 and/or exterior walls 174 of the housing 30. For example, the-housing 30 may be fabricated from a metal material with the interior walls 160 and/or the exterior walls 174 also fabricated from the metal material. In an exemplary embodiment, the housing 30 is diecast using a metal or metal alloy, such as aluminum or an aluminum alloy. With the entire housing 30 being metal, the housing 30, including the portion of the housing 30 between the plug cavities 42 (e.g. the interior walls 160) and the portion of the housing 30 covering the plug cavities 42 (e.g. the exterior walls 174), operates to provide shielding around the plug cavities 42. In such an embodiment, the housing 30 itself defines the shield elements (s) 172. The plug cavities 42 may be completely enclosed (e.g. circumfenentially surrounded) by the shield elements 172.

With each contact set 146 (shown in FIG. 6) arranged within a different plug cavity 42, the shield elements 172 provide shielding between adjacent contact-sets 146. The shield elements 172 thus provide isolation between the adjacent contact sets 146 to enhance the electrical performance of the contact sets 146 received in each plug cavity 42. Having shield elements 172 between adjacent plug cavities 42 provides better shield effectiveness for the cable interconnect system 10 (shown in FIG. 1), which may enhance electrical performance in systems that utilize components that do not provide shielding between adjacent plug cavities 42. For example, having shield elements 172 between adjacent plug cavities 42 within a given row 44, 46 enhances electrical performance of the contact sets 146. Additionally, having shield elements 172 between the rows 44, 46 of plug cavities 42 may enhance the electrical performance of the contact sets 146. The shield elements 172 may reduce alien crosstalk between adjacent contact sets 146 in a particular cassette and/or reduce alien crosstalk with contact sets 146 of different cassettes 20 or other electrical components in the vicinity of the cassette 20. The shield elements may also enhance electrical performance of the cassette 20 in other ways, such as by providing EMI shielding or by affecting coupling attenuation, and the like.

In an alternative embodiment, rather than the housing 30 being fabricated from a metal material, the housing 30 may be fabricated, at least in part, from a dielectric material. Optionally, the housing 30 may be selectively metallized, with the metallized portions defining the shield elements 172. For example, at least a portion of the housing 30 between the plug cavities 42 may be metallized to define the shield elements 172 between the plug cavities 42. Portions of the interior walls 160 and/or the exterior walls 174 may be metallized. The metallized surfaces define the shield elements 172. As such, the shield elements 172 are provided on the interior walls 160 and/or the exterior walls 174. Alternatively, the shield elements 172 may be provided on the interior walls 160 and/or the exterior walls 174 in a different manner, such as by plating or by coupling separate shield elements 172 to the interior walls 160 and/or the exterior walls 174. The shield elements 172 may be arranged along the surfaces defining the plug cavities 42 such that at least some of the shield elements 172 engage the modular plugs 14 when the modular plugs 14 are loaded into the plug cavities 42. In other alternative embodiments, the walls 160 and/or 174 may be formed, at least in part, by metal filler materials provided within or on the walls 160 and/or 174 or metal fibers provided within or on the walls 160 and/or 174.

In another alternative embodiment, rather than, or in addition to, providing the shield elements 172 on the walls of the housing 30, the shield elements 172 may be provided within the walls of the housing 30. For example, the interior walls 160 and/or the exterior walls 174 may include openings 176 that are open-at the rear 36 and/or the front 34 such that the shield elements 172 may be loaded into the openings 176. The shield elements 172 may be separate metal components, such as plates, that are loaded into the openings 176. The openings 176, and thus the shield elements 172, are positioned between the plug cavities 42 to provide shielding between adjacent contact sets 146.

Figure 9:
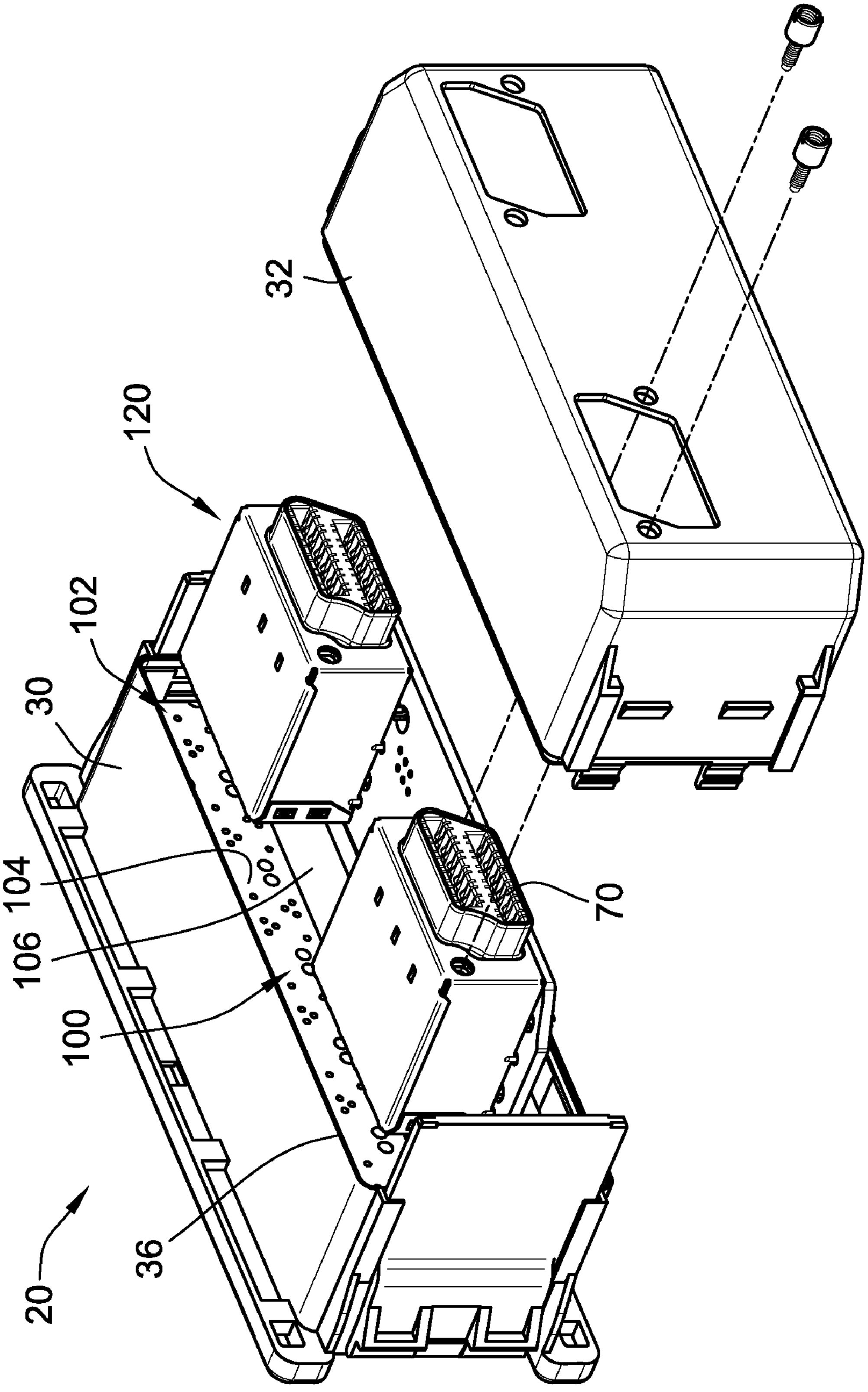
FIG. 9 is a rear perspective view of the cassette shown in FIG. 4 during assembly.

FIG. 9 is a rear perspective, partially assembled, view of the cassette 20. During assembly, the contact subassembly 100 is loaded into the rear chamber 102 of the housing 30 through the rear 36. Optionally, the circuit board 104 may substantially fill the rear chamber 102. The contact subassembly. 100 is loaded into the rear chamber 102 such that the electrical connector 106 faces the rear 36 of the housing 30. The electrical connector 106 may be at least partially received in the rear chamber 102 and at least a portion of the electrical connector 106 may extend from the rear chamber 102 beyond the rear 36.

During assembly, the interface connector assembly 120 is mated with the electrical connector 106. Optionally, the interface connector assembly 120 may be mated with the electrical connector 106 after the contact subassembly 100 is loaded into the housing 30. Alternatively, both the contact subassembly 100 and the interface connector assembly 120 may be loaded into the housing 30 as a unit. Optionally, some or all of the interface connector assembly 120 may be positioned rearward of the housing 30.

The cover 32 is coupled to the housing 30 after the contact subassembly 100 and the interface connector assembly 120 are positioned with respect to the housing 30. The cover 32 is coupled to the housing 30 such that the cover 32 surrounds the interface connector assembly 120 and/or the contact subassembly 100. In an exemplary embodiment, when the cover 32 and the housing 30 are coupled together, the cover 32 and the housing 30 cooperate to define an inner chamber 170 (shown in FIGS. 10 and 11). The rear chamber 102 of the housing 30 defines part of the inner chamber 170, with the hollow interior of the cover 32 defining another part of the inner chamber 170. The interface connector assembly 120 and the contact subassembly 100 are received in the inner chamber 170 and protected from the external environment by the cover 32 and the housing 30. Optionally, the cover 32 and the housing 30 may provide shielding for the components housed within the inner chamber 170. The rear mating connectors 70 may extend through the cover 32 when the cover 32 is coupled to the housing 30. As such, the rear mating connectors 70 may extend at least partially out of the inner chamber 170.

Figure 10:
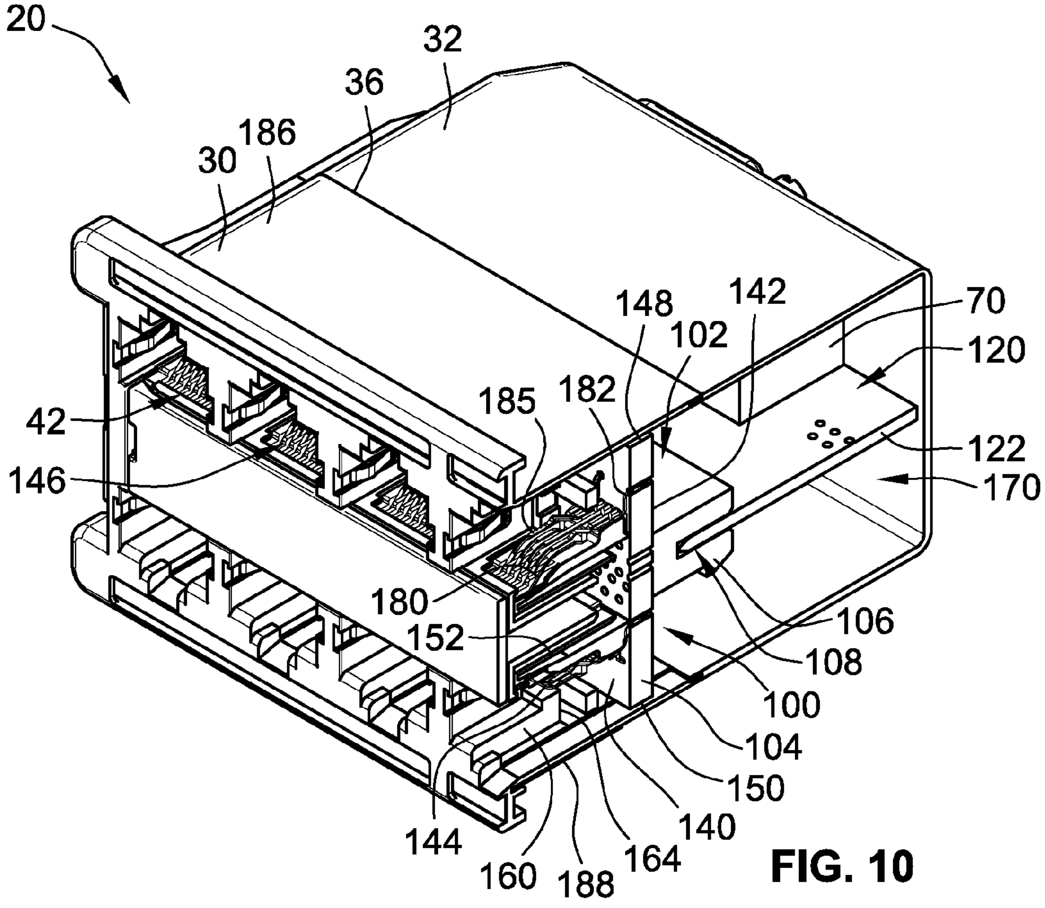
FIG. 10 is a side perspective, partial cutaway view of the cassette shown in FIG. 4.
Figure 11:
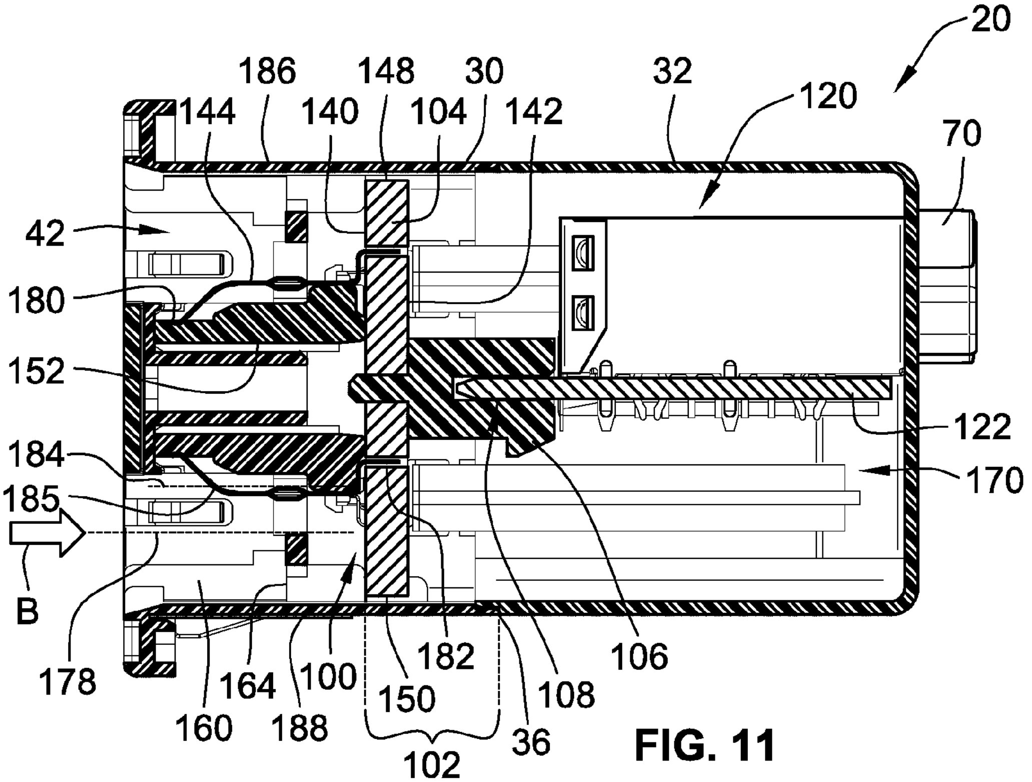
FIG. 11 is a cross-sectional view of the cassette shown in FIG. 4.

FIG. 10 is a side perspective, partial cutaway view of the cassette 20 and FIG. 11 is a cross-sectional view of the cassette 20. FIGS. 10 and 11 illustrate the contact subassembly 100 and the interface connector assembly 120 positioned within the inner chamber 170, with the cover 32 coupled to the housing 30. The contact subassembly 100 is loaded into the rear chamber 102 such that the front side 140 of the circuit board 104 generally faces and/or abuts against the rear surfaces 164 of the walls 160. Optionally, the front side 140 may abut against a structure of the housing 30, such as the rear surfaces 164 of the walls 160, or alternatively, a rib or tab that extends from the housing 30 for locating the contact subassembly 100 within the housing 30. When the contact subassembly 100 is loaded into the rear chamber 102, the contacts 144 and the contact supports 152 are loaded into corresponding plug cavities 42.

When assembled, the plug cavities 42 and the contact sets 146 cooperate to define the receptacles 16 for mating with the modular plugs 14 (shown in FIG. 11). The walls 160 of the housing 30 define the walls of the receptacles 16 and the modular plugs 14 engage the walls 160 when the modular plugs 14 are loaded into the plug cavities 42. The contacts 144 are presented within the plug cavities 42 for mating with plug contacts of the modular plugs 14. In an exemplary embodiment, when the contact subassembly 100 is loaded into the housing 30, the contact supports 152 are exposed within the plug cavities 42 and define one side of the box-like cavities that define the plug cavities 42.

Each of the contacts 144 extend between a tip 180 and a base 182 generally along a contact plane 184 (shown in FIG. 11). A portion of the contact 144 between the tip 180 and the base 182 defines a mating interface 185. The contact plane 184 extends parallel to the modular plug loading direction, shown in FIG. 11 by the arrow B, which extends generally along a plug axis 178. Optionally, the tip 180 may be angled out of the contact plane 184 such that the tips 180 do not interfere with the modular plug 14 during loading of modular plug 14 into the plug cavity 42. The tips 180 may be angled towards and/or engage the contact supports 152. Optionally, the bases 182 may be angled out of the contact plane 184 such that the bases 182 may be terminated to the circuit board 104 at a predetermined location. The contacts 144, including the tips 180 and the bases 182, may be oriented with respect to one another to control electrical properties therebetween, such as crosstalk. In an exemplary embodiment, each of the tips 180 within the contact set 146 are generally aligned one another. The bases 182 of adjacent contacts 144 may extend either in the same direction or in a different direction as one another. For example, at least some of the bases 182 extend towards the top 148 of the circuit board 104, whereas some of the bases 182 extend towards the bottom of 150 of the circuit board 104.

In an exemplary embodiment, the circuit board 104 is generally perpendicular to the contact plane 1.84 and the plug axis 178. The top 148 of the circuit board 104 is positioned near a top side 186 of the housing 30, whereas the bottom 150 of the circuit board 104 is positioned near a bottom side 188 of the housing 30. The circuit board 104 is positioned generally behind the contacts 144, such as between the contacts 144 and the rear 36 of the housing 30. The circuit board 104 substantially covers the rear of each of the plug cavities 42 when the connector subassembly 100 is loaded into the rear chamber 102. In an exemplary embodiment, the circuit board 104 is positioned essentially equidistant from the mating interface 185 of each of the contacts 144. As such, the contact length between the mating interface 185 and the circuit board 104 is substantially similar for each of the contacts 144. Each of the contacts 144 may thus exhibit similar electrical characteristics. Optionally, the contact length may be selected such that the distance between a mating interface 185 and the circuit board 104 is reasonably short. Additionally, the contact lengths of the contacts 144 in the upper row 44 (shown in FIG. 2) of plug cavities 42 are substantially similar to the contact lengths of the contacts 144 in the lower row 46 (shown in FIG. 2) of plug cavities 42.

The electrical connector 106 is provided on the rear side 142 of the circuit board 104. The electrical connector 106 is electrically connected to the contacts 144 of one or more of the contacts sets 146. The interface connector assembly 120 is mated with the electrical connector 106. For example, the circuit board 122 of the interface connector assembly 120 is loaded into the opening 108 of the electrical connector 106. The rear mating connectors 70, which are mounted to the circuit board 122, are electrically connected to predetermined contacts 144 of the contacts sets 146 via the circuit board 122, the electrical connector 106 and the circuit board 104. Other configurations are possible to interconnect the rear mating connectors 70 with the contacts 44 of the receptacles 16.

Figure 12:
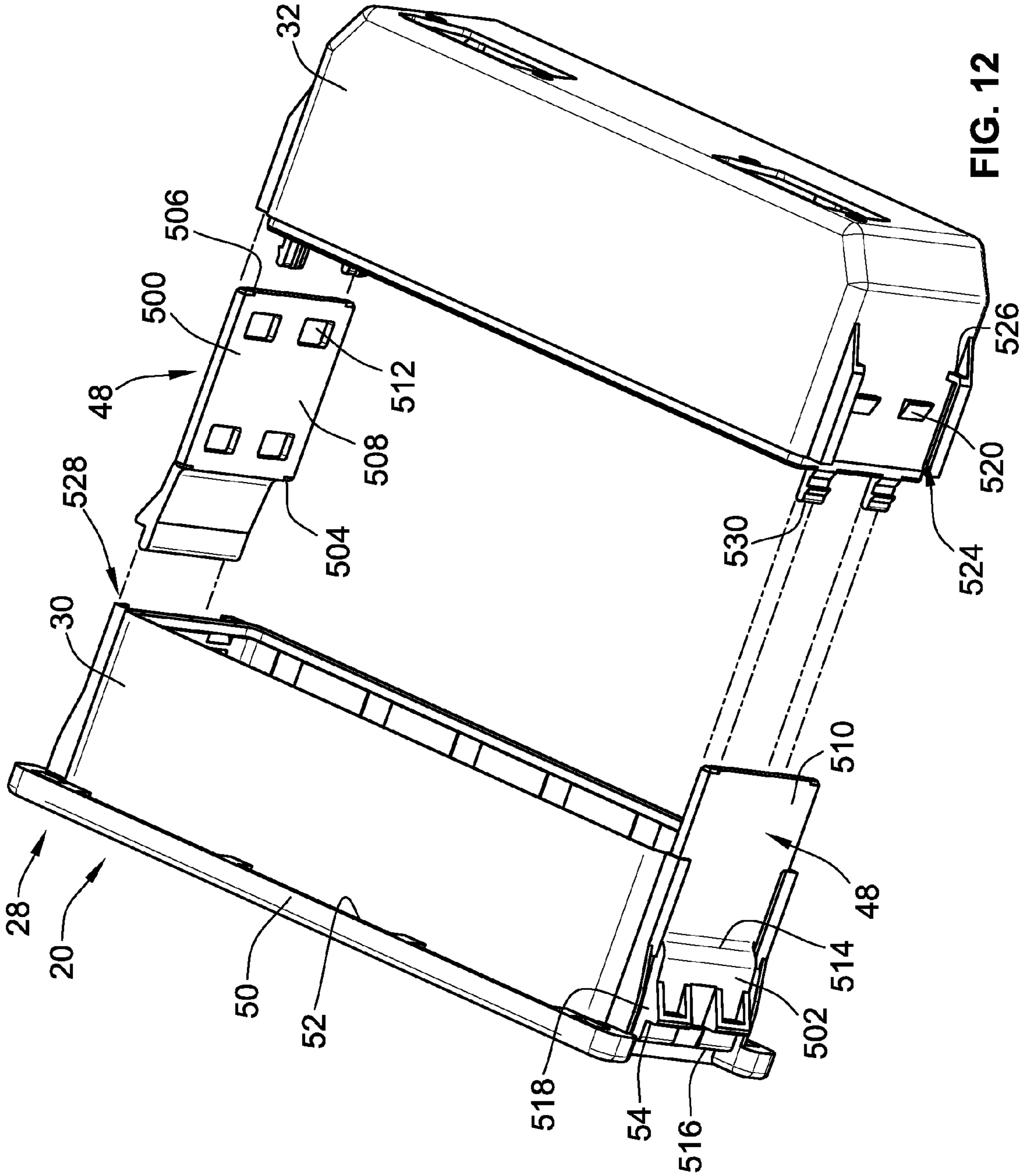
FIG. 12 is an exploded perspective view of a portion of the cassette shown in FIG. 1, illustrating a latch member for coupling a cover of the cassette to the housing shown in FIG. 7.

FIG. 12 is an exploded perspective view of a portion of the cassette 20, illustrating the latch members 48 for coupling the housing 30 to the cover 32 to form the shell 28. In an exemplary embodiment, the latch members 48 may be substantially identically formed. However, in alternative embodiments, the latch members 48 may be different, than one another. Each latch member 48 includes a base 500 and a latch element 502 extending from the base 500. The base 500 may be used to couple the housing 30 and the cover 32 to one another. The base 500 may be used to align the cover 32 with respect to the housing 30 during coupling of the cover 32 to the housing 30. The latch element 502 may be used to secure the cassette 20 to the panel 12 (shown in FIG. 1). The base 500 and/or latch element 502 may have other functions as well.

In an exemplary embodiment, the base 500 is a generally planar, plate-like structure extending between a front end 504 and a rear end 506. The base 500 has an inner surface 508 that faces the shell 28, and an outer surface 510 generally opposite the inner surface 508. In an exemplary embodiment, the base 500 includes a plurality of channels 512 formed therein. The channels 512 are open along the inner surface 508. Optionally, the channels 512 extend entirely through the base 500. In the illustrated embodiment, one or more channels 512 are provided proximate to each of the front end 504 and the rear end 506. As described in further detail below, the channels 512 engage portions of the housing 30 and/or the cover 32 to secure the housing 30 to the cover 32.

The latch element 502 extends from the base 500. In an exemplary embodiment, the latch element 502 extends from the base 500 proximate to the front end 504. The latch element 502 extends outward from the outer surface 510 generally away from the shell 28. The latch element 502 includes a fixed end 514 and a free end 516. The fixed end 514 is fixed to the base 500 and the free end 516 is positioned remote from the base 500. Optionally, the latch element 502 may extend forward of the base 500. The latch element.502 includes a hook 518 at the free end 516. The hook 518 has one or more of the panel engagement surfaces 54 that engage the panel 12 when the cassette 20 is mounted to panel 12. Optionally, the panel engagement surfaces 54 may be forward facing. The panel engagement surfaces 54 are positioned behind the rear engagement surfaces 52 of the front flange 50. When the cassette 20 is mated with the panel 12, the panel 12 is captured between the rear engagement surfaces 52 of the front flanges 50 and the panel engagement surfaces 54 of the latch element 502. The latch member 48 thus secures the shell 28 of the cassette 20 to the panel 12. The latch element 502 is deflectable generally towards the housing 30 until the hook 518 clears the opening 22 (shown in FIG. 2) in the panel 12 so that the cassette 20 may be removed from the panel 12.

The cover 32 is coupled to the housing 30 to form the shell 28. In an exemplary embodiment, the latch members 48 are used to couple the cover 32 to housing 30. The latch members 48 may be separately provided from both the housing 30 and the cover 32. The latch members 48 may be separately coupled to the housing 30 and to the cover 32. Optionally, the latch members 48 may be initially coupled to either the housing 30 or the cover 32 prior to being coupled to the other of the housing 30 or the cover 32. Alternatively, the latch member may be integrally formed with either the housing 30 or the cover 32 and used to couple the other component thereto.

The cover 32 includes one or more ribs 520 extending from the sides of the cover 32. The ribs 520 are received in the channels 512 in the base 500 to secure the cover 32 to the latch members 48. The housing 30 may also include ribs 522 (shown in FIG. 13) extending from the sides of the housing 30. The ribs 522 are received in the channels 512 in the base 500 to secure the housing 30 to the latch members 48.

In an exemplary embodiment, the cover 32 includes one or more troughs 524 extending from the sides of the cover 32. The troughs 524 receive the base 500 therein. In the illustrated embodiment, troughs 524 are provided on both the top and the bottom of the cover 32 to hold the base 500 next to the cover 32. The troughs 524 have a depth measured from the side of the cover 32 that is substantially similar to the thickness of the base 500 such that the latch members 48 may be held against the cover 32. The troughs 524 may have closed ends 526 that define a stop in limit movement of the latch members 48 with respect to the cover 32. The housing 30 includes one or more troughs 528 extending from the sides of the housing 30. The troughs 528 receive the base 500 in a similar manner as the troughs 524 of the cover 32. In an exemplary embodiment, the latch members 48 are received within the troughs 524 and/or 528 prior to the cover 32 being coupled to the housing 30. As such, when the latch members 48 engage the troughs 524, 528 of both the cover 32 and the housing 30, the latch members 48 operate to align the cover 32 with respect to the housing 30 so that the cover 32 may be coupled to the housing 30.

The cover 32 includes locking fingers 530 extending from the front 38 of the cover 32. The locking fingers 530 are configured to engage the housing 30 and/or the channels 512 of the base 500 when the cover 32 is coupled to the housing 30. The locking fingers 530 secure the cover 32 to the housing 30. As such, the locking fingers 530 and the latch members 48 both cooperate to secure the cover 32 to the housing 30. The locking fingers 530 operate as a backup latch to the latch members 48 to maintain the cover 32 and housing 30 in the coupled state even if the latch members 48 were to fail. Similarly, the latch members 48 operate as a backup latch to the locking fingers 530 to maintain the cover 32 and housing 30 in the coupled state even if the locking fingers 530 were to fail. In an alternative embodiment, the housing 30 may include locking fingers in addition to, or instead of the cover 32. In other alternative embodiments, neither the housing 30 nor the cover 32 include locking fingers, but rather rely on the latch members 48 to couple the cover 32 to housing 30.

Figure 13:
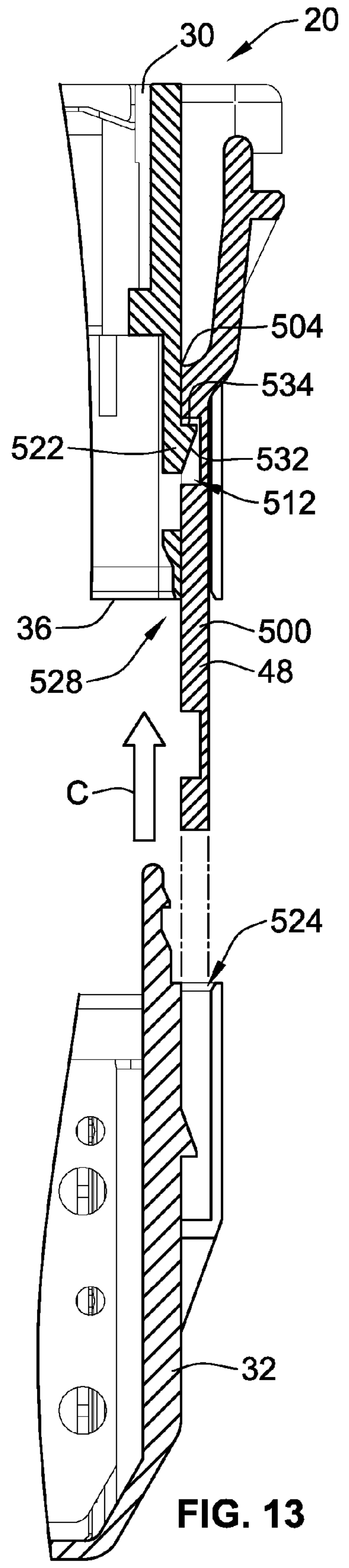
FIG. 13 is a cross-sectional view of a portion of the cassette shown in FIG. 1 during an assembly step.

FIG. 13 is a cross-sectional view of a portion of the cassette 20 during an assembly step in which the cover 32 is being coupled to the housing 30. Prior to coupling the cover 32 to the housing 30, the latch member 48 is coupled to the housing 30. The latch member 48 is coupled to the housing 30 by sliding the base 500 into the troughs 528 of the housing 30. The latch member 48 is slid into the troughs 528 from the rear 36 of the housing 30. Optionally, the latch member 48 may be slid into the troughs 528 until the front end 504 engages the closed ends of the troughs 528. The latch member 48 is slid into the troughs 528 until the latch member 48 is coupled to the housing 30. In an alternative embodiment, the latch member 48 may be coupled to the cover 32 prior to the cover 32 and the latch member 48 being coupled-to the housing 30.

When the latch member 48 is coupled to the housing 30, the ribs 522 of the housing 30 are received in the channels 512 of the latch member 48. Each rib 522 includes a rearward facing ramp surface 532 and a forward facing stop surface 534. As the latch member 48 is slid into the troughs 528, the latch member 48 slides along the ramp surfaces 532 until the channels 512 are aligned with the ribs 522. The ribs 522 may be forced into the channels 512 such that the stop surfaces 532 block the latch member 48 from being pulled out of the troughs 528, such as in rearward direction. The ribs 522 capture the latch member 48 within the troughs 528.

When the latch member 48 is coupled to the housing 30, a rear portion of the base 500 extends rearward from the rear 36 of the housing 30. When mating the cover 32 to the housing 30, the cover 32 is generally aligned with the housing 30 such that the latch element 48 is aligned with the troughs 524 of the cover 32. As the cover 32 is coupled to the housing 30, the base 500 is received within the troughs 524 of the cover 32. The cover 32 is mated in a mating direction, shown by the arrow C.

Figure 14:
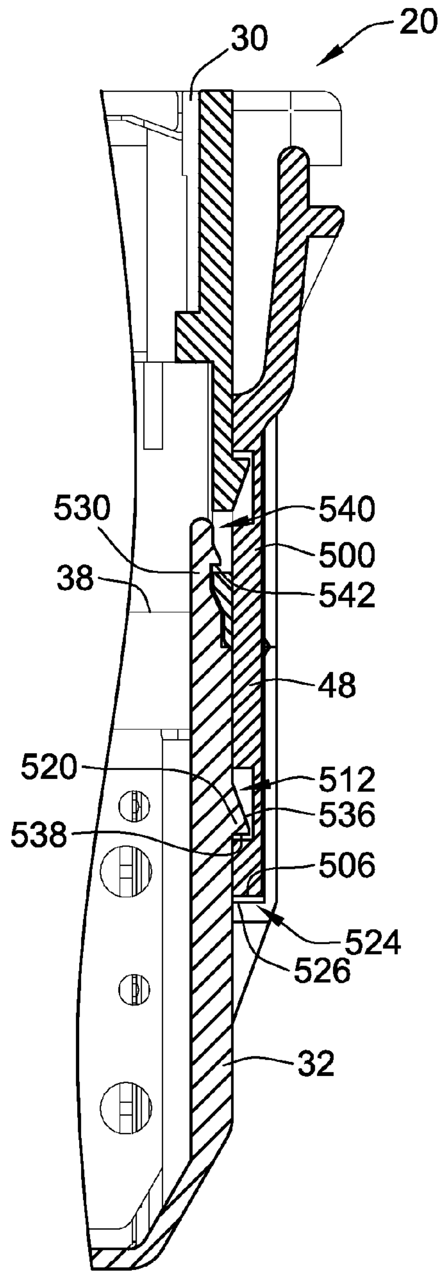
FIG. 14 as a cross-sectional view of a portion of the cassette shown in FIG. 1 in an assembled state.

FIG. 14 as a cross-sectional view of a portion of the cassette 20 in an assembled state in which the cover 32 is coupled to the housing 30. The latch member 48 is coupled to the cover 32 by sliding the base 500 into the troughs 524 of the cover 32. The latch member 48 is slid into the troughs 524 from the front 38 of the cover 32. Optionally, the latch member 48 may be slid into the troughs 524 until the rear end 506 engages the closed ends 526 of the troughs 524. The latch member 48 is slid into the troughs 524 until the latch member 48 is coupled to the cover 32.

When the latch member 48 is coupled to the cover 32, the ribs 520 of the cover 32 are received in the channels 512 of the latch member 48. Each rib 520 includes a forward facing ramp surface 536 and a rearward facing stop surface 538. As the latch member 48 is slid into the troughs 524, the latch member 48 slides along the ramp surface 536 until the channels 512 are aligned with the ribs 520. The ribs 520 may be forced into the channels 512 such that the stop surfaces 538 block the latch member 48 from being pulled out of the troughs 524, such as in a forward direction. The ribs 520 capture the latch member 48 within the troughs 524.

When assembled, the latch member 48 locks the housing 30 to the cover 32. In an exemplary embodiment, the latch member 48 spans across both the housing 30 and the cover 32 and separately engages both the housing 30 and the cover 32 to hold the components together. Optionally, the locking finger 530 may also lock the cover 32 to the housing 30. When the cover 32 is mated with the housing 30, the locking finger 530 is received within an opening 540 in the side of the housing 30. The locking finger 530 slides along a portion of the housing 30 to a locked position. Optionally, the locking finger 530 may engage the housing 30 substantially simultaneously with the latch member 48 latching to the cover 32. The locking finger 530 includes a locking surface 542 that engages the housing 30 to resist removal of the cover 32 from:the housing 30. Optionally, the locking finger 530 may be biased out of the opening 540 to allow the cover 32 to be removed from housing 30. Similarly, the ribs 520, 522 may be removed from the channels 512 to allow the latch member 48 to be removed from the cover 32 and housing 30, respectively.

A cassette 20 is thus provided that may be mounted to a panel 12 through an opening 22 in the panel 12. The cassette 20 includes a plurality of modular receptacles 16 that are configured to receive modular plugs 14 therein. The cassette 20 includes a contact subassembly 100 and an interface connector assembly 120. The contact subassembly 100 is loaded into a housing 30 and the contact subassembly 100 and interface connector assembly 120 are surrounded by the housing 30 and/or a cover 32. The cassette 20 includes latch members 48 that separately couple to both the housing 30 and the cover 32 to securely couple the cover 32 to the housing 30. The latch members 48 include latch elements 502 that are used to secure the cassette 20 to the panel 12. The latch elements 502 engage a rear surface of the panel 12 to hold the cassette 20 within an opening 22 in the panel 12. The latch members 48 may also be used to align the cover 32 to the housing 30 during mating of the cover 32 to the housing 30. The latch members 48 are slidably coupled to both the housing 30 and the cover 32. Optionally, substantially identical latch members 48 may be provided on both sides of the cassette 20. Separate locking lingers 530 may be used in addition to the latch members 48 to couple the cover 32 to the housing 30.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cassette comprising:

a shell having a housing and a cover mated together, the shell defining an inner chamber bounded by the housing and the cover, the housing having a plurality of plug cavities configure to receive plugs therein;

a contact subassembly received in the inner chamber, the contact subassembly having a circuit board and a plurality of contacts coupled to the circuit board, the circuit board housed within the inner chamber, the contacts being arranged in contact sets that are received in the corresponding plug cavities to mate with different corresponding plugs; and a latch member coupling the housing to the cover, the latch member having a generally planar base spanning the housing and the cover, the base coupled to the housing and the cover, the latch member having a latch element configured to secure the shell to a panel, the latch element being cantilevered from the base and being deflectable toward the base.

2. The cassette of claim 1, wherein the latch member is separate from both the housing and the cover and the latch member is coupled to both the housing and the cover.

3. The cassette of claim 1, wherein the housing includes a rib extending therefrom, the latch member includes a channel that receives the rib to secure the relative position of the latch member with respect to the housing.

4. The cassette of claim 1, wherein the cover includes a rib extending therefrom, the latch member includes a channel that receives the rib to secure the relative position of the latch member with respect to the cover.

5. The cassette of claim 1, wherein the housing includes a trough, the latch member being received within the trough to position the latch member with respect to the housing.

6. The cassette of claim 1, wherein the cover includes a trough, the latch member being received within the trough to position the latch member with respect to the cover.

7. The cassette of claim 1, wherein the housing includes a front flange, and wherein the latch element includes a panel engagement surface, the shell being positioned with respect to the panel such that the panel is captured between the front flange and the panel engagement surface.

8. The cassette of claim 1, wherein the latch member is coupled to either the housing or the cover prior to the cover being coupled to the housing.

9. The cassette of claim 1, wherein the shell defines a box-shaped outer perimeter having a front, a rear, a top, a bottom and opposite sides, the latch member being coupled to a corresponding side of the shell.

10. The cassette of claim 1, wherein the housing includes a front, the plug assemblies being open at the front, the circuit board being received in the inner chamber such that the circuit board is parallel to the front.

11. A cassette comprising:

a shell having a housing and a cover mated together to define an inner chamber, the housing having a plurality of plug cavities configure to receive plugs therein, at least one of the housing and the cover having a locking finger engaging the other one of the housing and the cover to secure the cover to the housing, the locking finger includes a hook configured to be received in an opening to lock the cover to the housing;

a contact subassembly received in the inner chamber, the contact subassembly having a circuit board and a plurality of contacts coupled to the circuit board, the circuit board housed within the inner chamber, the contacts being arranged in contact sets that are received in corresponding plug cavities to mate with different corresponding plugs; and a latch member separately provided from the housing and the cover, the latch member being separately coupled to both the housing and the cover to secure the cover to the housing.

12. The cassette of claim 11, wherein the locking finger and the latch member operate as back up locking features to one another to secure the cover to the housing when the other of the locking finger and the latch member fail.

13. The cassette of claim 11, wherein the locking finger is engaged substantially simultaneously with the latch member being coupled to the housing and the cover.

14. The cassette of claim 11, wherein the locking finger and the latch member are slidable to a locked position.

15. The cassette of claim 11, wherein the housing includes a rib extending therefrom, the latch member includes a channel that receives the rib to secure the relative position of the latch member with respect to the housing.

16. The cassette of claim 11, wherein the latch member includes a base spanning the housing and the cover, the base being coupled to both the housing and the cover.

17. The cassette of claim 11, wherein the shell defines a box-shaped outer perimeter having a front, a rear, a top, a bottom and opposite sides, the latch member being coupled to a corresponding side of the shell along the outside of both the housing and the cover.

18. A cassette comprising:

a shell having a housing and a cover mated together to define an inner chamber, the housing having a plurality of plug cavities configure to receive plugs therein;

a contact subassembly received in the inner chamber, the contact subassembly having a circuit board and a plurality of contacts coupled to the circuit board, the circuit board housed within the inner chamber, the contacts being arranged in contact sets that are received in corresponding plug cavities to mate with different corresponding plugs; and a latch member coupling the housing to the cover, the latch member having a generally planar base spanning the housing and the cover, the base coupled to both the housing and the cover, the latch member having a latch element configured to secure the shell to a panel, the latch element being cantilevered from the base and being deflectable toward the base, the latch member extending from either the housing or the cover towards the other of the housing or the cover prior to coupling the cover to the housing, the latch member aligning the cover with the housing as the cover is coupled to the housing.

19. The cassette of claim 18, wherein the cover includes a trough, the latch member being received within the trough to align the cover with the housing.

20. The cassette of claim 18, wherein the shell defines a box-shaped outer perimeter having a front, a rear, a top, a bottom and opposite sides, the latch member being coupled to a corresponding side of the shell and extending along the outside of both the housing and the cover.

* * * * *